(12) United States Patent
Brandt et al.

(10) Patent No.: US 11,152,760 B2
(45) Date of Patent: Oct. 19, 2021

(54) LIGHT EMITTER DEVICE BASED ON A PHOTONIC CRYSTAL WITH PILLAR- OR WALL-SHAPED SEMICONDUCTOR ELEMENTS, AND METHODS FOR THE OPERATION AND PRODUCTION THEREOF

(71) Applicant: Forschungsverbund Berlin e.V., Berlin (DE)

(72) Inventors: Oliver Brandt, Berlin (DE); Lutz Geelhaar, Berlin (DE); Ivano Giuntoni, Berlin (DE)

(73) Assignee: Forschungsverbund Berlin e.V., Berlin (DE)

( * ) Notice: Subject to any disclaimer, the term of this patent is extended or adjusted under 35 U.S.C. 154(b) by 0 days.

(21) Appl. No.: 16/469,484

(22) PCT Filed: Dec. 5, 2017

(86) PCT No.: PCT/EP2017/081498
§ 371 (c)(1),
(2) Date: Jun. 13, 2019

(87) PCT Pub. No.: WO2018/108624
PCT Pub. Date: Jun. 21, 2018

(65) Prior Publication Data
US 2020/0119519 A1    Apr. 16, 2020

(30) Foreign Application Priority Data
Dec. 14, 2016    (DE) .......................... 102016014938.8

(51) Int. Cl.
*H01S 5/0625*    (2006.01)
*H01S 5/12*    (2021.01)
(Continued)

(52) U.S. Cl.
CPC ...... *H01S 5/06255* (2013.01); *H01S 5/04253* (2019.08); *H01S 5/11* (2021.01);
(Continued)

(58) Field of Classification Search
CPC ......... H01S 5/1206–1218; H01S 5/105; H01S 5/187; H01S 5/341–3412; H01S 5/1042;
(Continued)

(56) References Cited

U.S. PATENT DOCUMENTS 5,329,542 A * 7/1994 Westbrook ............ H01S 3/0635
372/96
5,784,400 A * 7/1998 Joannopoulos ........ B82Y 20/00
372/50.1
(Continued)

FOREIGN PATENT DOCUMENTS

CN    105742958 A  *  7/2016
CN    107706741 A  *  2/2018
(Continued)

OTHER PUBLICATIONS

David et al., "Photonic crystal light-emitting sources", Rep. Prog. Phys., vol. 75, 126501 (2012).
(Continued)

*Primary Examiner* — Joshua King
(74) *Attorney, Agent, or Firm* — Caesar Rivise, PC

(57) ABSTRACT

A light emitter device (100) comprises a substrate (10) and a photonic crystal (20), which is arranged on the substrate (10) and comprises pillar- and/or wall-shaped semiconductor elements (21), which are arranged periodically standing out from the substrate (10), wherein the photonic crystal (20) forms a resonator, in which the semiconductor elements (21) are arranged in a first resonator section (22) with a first period ($d_1$), in a second resonator section (23) with a second period ($d_2$) and in a third resonator section (24) with a third
(Continued)

period ($d_3$), wherein on the substrate (10) the second resonator section (23) and the third resonator section (24) are arranged on two mutually opposing sides of the first resonator section (22) and the second period ($d_2$) and the third period ($d_3$) differ from the first period (d1), the first resonator section (22) forms a light-emitting medium and the third resonator section (24) forms a coupling-out region, through which a part of the light field in the first resonator section (22) can be coupled out of the resonator in a light outcoupling direction parallel to a substrate surface (11) of the substrate (10). Methods for operating and producing the light emitter device (100) are also described.

19 Claims, 2 Drawing Sheets

(51) Int. Cl.
| | | |
|---|---|---|
| H01S 5/187 | (2006.01) | |
| H01S 5/042 | (2006.01) | |
| H01S 5/34 | (2006.01) | |
| H01S 5/11 | (2021.01) | |
| H01S 5/02 | (2006.01) | |
| H01S 5/04 | (2006.01) | |
| H01S 5/10 | (2021.01) | |

(52) U.S. Cl.
CPC .............. *H01S 5/12* (2013.01); *H01S 5/1206* (2013.01); *H01S 5/187* (2013.01); *H01S 5/341* (2013.01); *H01S 5/021* (2013.01); *H01S 5/041* (2013.01); *H01S 5/1075* (2013.01); *H01S 2301/176* (2013.01)

(58) Field of Classification Search
CPC ....... H01S 5/1071–1075; H01S 5/1046; H01S 5/12–125
See application file for complete search history.

(56) References Cited

U.S. PATENT DOCUMENTS

| | | | | |
|---|---|---|---|---|
| 6,466,709 | B1* | 10/2002 | Scherer | B82Y 20/00 |
| | | | | 372/19 |
| 7,058,095 | B2 | 6/2006 | Mahnkopf et al. | |
| 7,079,240 | B2* | 7/2006 | Scherer | B82Y 20/00 |
| | | | | 356/128 |
| 8,471,352 | B2* | 6/2013 | Ellis | H01S 5/3063 |
| | | | | 257/458 |
| 9,184,235 | B2 | 11/2015 | Brandt et al. | |
| 2002/0167984 | A1* | 11/2002 | Scherer | B82Y 20/00 |
| | | | | 372/50.1 |
| 2004/0105476 | A1* | 6/2004 | Wasserbauer | H01S 5/141 |
| | | | | 372/50.22 |
| 2004/0125832 | A1* | 7/2004 | Mahnkopf | H01S 5/06255 |
| | | | | 372/20 |
| 2004/0135155 | A1* | 7/2004 | Otsuka | H01S 5/187 |
| | | | | 257/79 |
| 2006/0194359 | A1* | 8/2006 | Weisbuch | H01S 5/12 |
| | | | | 438/35 |
| 2006/0275005 | A1 | 12/2006 | Hoshi et al. | |
| 2007/0013991 | A1* | 1/2007 | Kise | G02B 6/1225 |
| | | | | 359/245 |
| 2007/0125995 | A1* | 6/2007 | Weisbuch | B82Y 20/00 |
| | | | | 257/9 |
| 2007/0153864 | A1* | 7/2007 | Lidorikis | H01S 5/20 |
| | | | | 372/50.124 |
| 2007/0253456 | A1* | 11/2007 | Yagi | H01S 5/1228 |
| | | | | 372/45.012 |
| 2008/0192779 | A1 | 8/2008 | Ikuta | |
| 2008/0225918 | A1* | 9/2008 | Achtenhagen | H01S 5/22 |
| | | | | 372/44.01 |
| 2009/0225804 | A1* | 9/2009 | Sasahata | B82Y 20/00 |
| | | | | 372/45.01 |
| 2011/0140072 | A1 | 6/2011 | Varangis et al. | |
| 2012/0072931 | A1* | 3/2012 | Imada | G11B 7/1384 |
| | | | | 720/672 |
| 2014/0219306 | A1 | 8/2014 | Wright et al. | |
| 2014/0226691 | A1* | 8/2014 | Kim | H01S 5/1028 |
| | | | | 372/45.01 |
| 2014/0286367 | A1* | 9/2014 | Scofield | H01S 5/1042 |
| | | | | 372/43.01 |
| 2014/0312301 | A1 | 10/2014 | Brandt et al. | |
| 2015/0063753 | A1* | 3/2015 | Evans | G02B 6/132 |
| | | | | 385/37 |
| 2015/0222092 | A1* | 8/2015 | Kim | H01S 5/1042 |
| | | | | 438/31 |
| 2016/0118774 | A1* | 4/2016 | Skiba-Szymanska | H04L 9/08 |
| | | | | 372/45.01 |
| 2020/0091682 | A1* | 3/2020 | Giuntoni | H01S 5/3412 |

FOREIGN PATENT DOCUMENTS

| | | | | |
|---|---|---|---|---|
| DE | 10254909 A1 | | 6/2004 | |
| DE | 102011118273 A1 | | 5/2013 | |
| EP | 1804350 A1 | * | 7/2007 | ............ H01S 5/341 |
| JP | 2001102625 A | * | 4/2001 | ............ B82Y 20/00 |
| JP | 2009043918 A | * | 2/2009 | ............ H01S 5/18 |
| WO | WO-02084822 A3 | * | 3/2004 | ............ H01S 5/12 |
| WO | WO-2018004549 A1 | * | 1/2018 | ............ G06N 10/00 |

OTHER PUBLICATIONS

Scofield et al., "Bottom-up Photonic Crystal Lasers", Nano Lett, vol. 11, pp. 5387-5390 (2011).
International Search Report for PCT/EP2017/081498, dated Feb. 8, 2018.

* cited by examiner

LIGHT EMITTER DEVICE BASED ON A PHOTONIC CRYSTAL WITH PILLAR- OR WALL-SHAPED SEMICONDUCTOR ELEMENTS, AND METHODS FOR THE OPERATION AND PRODUCTION THEREOF

CROSS-REFERENCE TO RELATED APPLICATIONS

This application is a U.S. National Phase Application of PCT/EP2017/081498, filed Dec. 5, 2017, which claims priority from DE 10 2016 014 938.8 filed Dec. 14, 2016, the contents of which applications are incorporated herein by reference in their entireties for all purposes.

BACKGROUND OF THE INVENTION

The invention relates to a light emitter device comprising a photonic crystal having a plurality of pillar-shaped and/or wall-shaped semiconductor elements (nanostructured semiconductor elements, in particular nanowires and/or nanowalls), in particular to a surface emitter device, and to methods for operating and producing said device. Applications of the invention lie in generating coherent light (laser light) or in single-photon emission, in particular in optoelectronics.

It is generally known to produce light emitting components from nanostructured semiconductor elements that have characteristic dimensions in the sub-micrometer range (for instance see DE 10 2011 118 273 A1 and the publications cited therein). By selective etching of planar semiconductors ("top-down" technique) or by epitaxial growth of nanostructured semiconductor elements on a substrate ("bottom-up" technique), it is possible to form, for example, pillar-shaped semiconductor elements (nanowires, nanopillars) or wall-shaped semiconductor elements (nanowalls, nanoplates, nanosheets) on the substrate.

Of interest in particular are semiconductor elements having heterostructures made of compound semiconductors based on nitrides, arsenides and phosphides of group III atoms (group III-nitride semiconductors, group III-arsenide semiconductors and group III-phosphide semiconductors), because these have bandgaps corresponding to wavelengths from the near infrared to ultraviolet.

Nanostructured semiconductor elements, for example made of group III-nitride semiconductors, have the particular advantage that it is possible to overcome limitations in planar technology arising from the lattice mismatch with respect to Si substrates. Although purely elastic strain relaxation requires the semiconductor elements to have small diameters in the region of 10 nm, the lattice mismatch is actually non-critical even at larger values, for instance up to several hundred nanometers, because dislocation lines that arise are confined to the region of the interface or deviate to the side walls of the semiconductor elements. Base surfaces of the nanostructured semiconductor elements having typical dimensions of less than several hundred nanometers therefore allow group III-nitride semiconductors, for example, to be grown on Si substrates in better crystal quality.

US 2014/0286367 A1 (see also A. C. Scofield et al. in "Nanoletters" (2011, 11, 5387-5390)) describes a laser resonator having a photonic crystal made of GaAs/(In,Ga)As/GaAs-based nanowires on a GaAs substrate. Metal-organic chemical vapor deposition (MOCVD) is used to arrange the nanowires in a periodic manner on the substrate. The periodicity of the nanowires in a central region (cavity) is selected such that the nanowires form an active laser medium (gain medium). In addition, the periodicity in an outer region, which surrounds the central region, is selected such that the extent of the light field is confined to the cavity. The photonic crystal forms a resonator. Optical excitation of the gain medium causes optical emission from the nanowires, which is amplified in the resonator until stimulated emission is reached (laser operation). US 2014/0219306 A1 describes another photonic crystal that is designed to generate laser light.

Although laser operation has been achieved by the photonic crystal described in US 2014/0286367 A1, for example, this conventional technology is not applicable in practice, in particular in Si-based optoelectronics, because of the following limitations. First, it describes solely a laterally-enclosed resonator from which laser light is emitted only in a relatively large angular range in the half-space above the photonic crystal. There is no description, however, of a measure for transmitting (coupling) the generated laser light into an optoelectronic application. Furthermore, only an optically excited photonic crystal on a GaAs substrate has been implemented as a practical example. US 2014/0286367 A1 does not describe how the resonator could be constructed on a Si substrate, which is relevant to most uses, and how electrical excitation of the laser light could be performed in practice.

US 2014/0226691 A1 discloses a miniaturized laser comprising a photonic crystal on a Si substrate, which crystal is formed by holes in a compact semiconductor material ("top-down" technique). This laser has the disadvantage that it does not have a monolithic construction. The emitting semiconductor material must be bonded to the Si substrate using a wafer-bonding process. This results in disadvantages in terms of heat dissipation and/or reproducibility in production.

The objective of the invention is to provide an improved light emitter device comprising a photonic crystal having a plurality of nanostructured semiconductor elements, which light emitter device overcomes disadvantages of conventional technologies. The light emitter device shall be characterized in particular by higher efficiency of the transmission of the generated light into adjacent optical components, for instance detector elements and/or waveguides, by simplified non-optical excitation of the light emission, and/or by improved suitability for integration in Si-based semiconductor devices, in particular Si-based optoelectronics. It is also the objective of the invention to provide improved methods for operating and producing said light emitter device, which methods avoid the disadvantages of conventional methods for operating and producing light emitters.

These objectives are achieved by the light emitter device of the invention and the methods of the invention for operating and producing same.

BRIEF SUMMARY OF THE INVENTION

According to a first general aspect of the invention, the aforementioned objective is achieved by a light emitter device comprising a photonic crystal made of nanostructured semiconductor elements, in particular pillar-shaped and/or wall-shaped semiconductor elements. The semiconductor elements are arranged, preferably vertically upright, on a substrate in a periodic manner, i.e. the base surfaces of the semiconductor elements form on the substrate a periodic one-dimensional or two-dimensional lattice. The photonic crystal forms a resonator and comprises a first resonator segment (or cavity segment), a second resonator segment and a third resonator segment.

The semiconductor elements in the first resonator segment form the active, light-emitting medium. According to a preferred variant of the invention, the light emitter device is designed to emit coherent light. In this case, the first resonator segment forms a gain medium. According to an alternative variant of the invention, the light emitter device is designed as a single-photon emitter. In this case, the photonic crystal is designed to increase the emission rate and the extraction efficiency for single photons emitted in the first resonator segment.

The light field propagating in the first resonator segment is described in terms of ray optics or wave optics depending on the extent of the first resonator segment along the substrate surface. If the first resonator segment is sufficiently large for a ray-optics representation of the light field, the second and third resonator segments are also referred to as reflector segments (or mirror segments). Otherwise, if the extent of the first resonator segment calls for a wave-optics representation of the light field, the second and third resonator segments are also referred to as confinement segments.

The second resonator segment is arranged at least on a first side of the first resonator segment, and the third resonator segment is arranged on a second side of the first resonator segment, which second side differs from the first side and is preferably opposite thereto, said second and third resonator segments preferably being arranged immediately adjoining the first resonator segment.

The semiconductor elements in the first resonator segment are arranged at a first period (first spacing, emitter period), whereas the semiconductor elements in the second and third resonator segments are arranged at a second period and third period respectively (second spacing and third spacing respectively), both of which differ from the first period. The first, second and third periods are the lattice spacings of the semiconductor elements in the photonic crystal, in particular the spacings of the semiconductor elements in a cavity main direction in which a resonant light field propagates in the first resonator segment. Pillar-shaped semiconductor elements preferably form a regular two-dimensional lattice. Wall-shaped semiconductor elements preferably form a regular one-dimensional lattice.

The first period in the first resonator segment is selected depending on the electronic band properties of the semiconductor elements and the effective refractive index of the first resonator segment such that light can be stimulated at a predetermined emission wavelength. The first period is smaller than the second period and third period. The first resonator segment, and the second and third resonator segments, which as reflector segments or confinement segments enclose the first resonator segment and are arranged along the cavity main direction for the purpose of light circulation, form a resonator. As described later, the first period is selected according to the emission wavelength of the first resonator segment and the effective refractive index. Linear or circular modes of the emitted light can be formed in the first resonator segment depending on the geometry of this segment.

The second and third periods are selected on the basis of the Bragg condition according to the emission wavelength of the first resonator segment such that light in the first resonator segment inside the cavity is reflected along the optical axis, or as a circular mode, is enclosed between the second and third resonator segments. Consequently, the second period and the third period are preferably equal. The dimension, e.g. length or inner circumference of the cavity, is likewise selected according to the emission wavelength of the first resonator segment such that light in the first resonator segment interferes constructively in a resonant manner.

According to the invention, the third resonator segment forms an output coupling region, through which some of the light field in the first resonator segment can be coupled out of the first resonator segment in a light output coupling direction parallel to a substrate surface of the substrate. The third resonator segment allows partial transmission of the light field, so that a portion of the light emitted in the first resonator segment can exit the resonator through the third resonator segment. The light path of the exiting emitted light extends in the light output coupling direction.

The light emitter device according to the invention is advantageously configured for directional emission through the third resonator segment in the light output coupling direction parallel to the surface of the substrate. Emission in the specified light output coupling direction replaces the inefficient and non-directional emission into a wide angular range in the half-space above the substrate by the laser structure according to US 2014/0286367 A1 or A. C. Scofield et al. The output coupling efficiency for the emitted light from the resonator can advantageously be selected by configuring the third resonator segment, for instance by the reflectivity or transmissivity thereof.

The invention has the advantage that by providing a lateral, partially transmissive resonator segment, the photonic crystal is designed such that light is coupled out laterally parallel to the substrate plane. Thus a structure is created that differs from US 2014/0286367 A1 both in terms of the arrangement of the semiconductor elements and in terms of the light guidance.

The invention has the additional advantage, in particular over US 2014/0226691 A1, that a plurality of light emitter devices can be constructed simultaneously in the "bottom-up" technique monolithically and in a single deposition process. In comparison with the non-monolithic structure from US 2014/0226691 A1, this results in advantages in terms of heat dissipation and/or reproducibility in production. In addition, the entire production process takes place on Si substrates that are larger than the substrates made of III-V compound semiconductors used in non-monolithic production, allowing lower production costs.

The lateral output coupling from the resonator, in particular along the extent of the substrate, allows subsequent coupling of the emitted light into one or more waveguides, which preferably extend parallel to the substrate plane, and/or into a vertical coupler (described below), which is designed generally for directional emission in a direction that differs from the substrate plane, for instance perpendicular to, or at an angle to, the substrate surface.

Advantageously, different resonator configurations are possible, which can be selected according to the specific use of the invention.

According to a first variant (first embodiment of the invention), the second resonator segment and the third resonator segment are arranged solely on the two opposite sides of the first resonator segment, with the result that the photonic crystal forms a linear resonator having linear resonator modes. On the remaining sides, the first resonator segment adjoins a surrounding medium, for instance surrounding air or an embedding medium. The second resonator segment and the third resonator segment are both oriented to reflect the light field along the connecting line (optical axis, cavity main direction) between the second and third resonator segments. The light output coupling direction runs parallel to the optical axis of linear modes between the second resonator segment and the third resonator segment.

When the light field is described in terms of ray optics, the second and third resonator segments form reflector segments, where the second resonator segment is dimensioned such that it has a reflectivity of 100% or almost 100% (e.g. greater than 99%, in particular greater than 99.9%), and the third resonator segment has a lower reflectivity. The reflectivity of the third resonator segment is set in the range of 90% to 98%, for example.

In the first embodiment of the invention, the first, second and third periods of the semiconductor elements are the distances by which said semiconductor elements are spaced apart parallel to the optical axis. Pillar-shaped semiconductor elements preferably form a regular two-dimensional lattice, in which the first period and the second and third periods are formed parallel to the optical axis and orthogonal thereto. Wall-shaped semiconductor elements preferably form a regular one-dimensional lattice, in which the wall-shaped semiconductor elements are oriented perpendicular to the optical axis, and the first period and the second and third periods are formed parallel to the optical axis.

According to a second variant (second embodiment of the invention), the second resonator segment surrounds the first resonator segment on multiple sides, and the third resonator segment is arranged on a single side of the first resonator segment, with the result that the photonic crystal forms a circular resonator having circular resonator modes (also referred to as hexagonal modes or, for the ray-optics description, as whispering-gallery modes). The first resonator segment is enclosed parallel to the substrate surface by the second and third resonator segments. The light output coupling direction runs in a radial direction relative to the circular modes in the first resonator segment. Advantageously, the second embodiment of the invention can allow a particularly compact construction by exploiting the fact that the circular modes are formed in the cavity.

The second resonator segment preferably extends parallel to the substrate over an angular range of at least 300° around the first resonator segment, whereas the third resonator segment occupies only a narrow angular range, for instance over 60° or less, on the second side of the first resonator segment. Particularly preferably, the second resonator segment forms a continuous boundary to the first resonator segment on multiple sides.

According to a preferred embodiment of the invention, the third resonator segment has a smaller dimension in the light output coupling direction than the second resonator segment, while the semiconductor elements in the second and third resonator segments are arranged preferably at the same period. The smaller dimension of the third resonator segment reduces the reflectivity or the confinement efficiency to achieve the desired output coupling at the third resonator segment. The reflectivity or the confinement efficiency is set in the range of 90% to 98%, for example, compared with the second resonator segment.

Another advantage of the light emitter device according to the invention lies in the flexibility for additional orientation of the light exiting the resonator via the third resonator segment. For example, the light exiting in the light output coupling direction can be coupled directly into a waveguide segment, for instance into a waveguide integrated in the substrate, or into a waveguide arrangement of semiconductor elements or into an optical fiber arranged on the substrate, or can be emitted freely parallel to the substrate surface.

Alternatively or additionally, according to a particularly preferred embodiment of the invention, the light emitter device is configured as a surface emitter device for directional emission of the coupled-out light from the substrate surface, preferably perpendicular to the substrate surface. In this case, additional semiconductor elements, which form a deflection segment, are arranged in a periodic manner outside the resonator preferably adjoining the third resonator segment or the waveguide segment. A waveguide integrated in the substrate or a waveguide arrangement of semiconductor elements can be provided between the third resonator segment and the deflection segment. The semiconductor elements are arranged in the deflection segment at a fourth period (fourth spacing, coupler period), which differs from the first period, second period and third period.

The deflection segment forms a vertical coupler. Advantageously, the vertical coupler does not deflect the emitted light in a non-directional manner into the half-space above the substrate but as a directional parallel light field (parallel beam) at a predetermined deflection direction relative to the substrate surface. The deflection direction is preferably selected in the range of 80° to 90°.

The fourth period is preferably larger than the second period and third period. This advantageously achieves high efficiency in the deflection of the emitted light. The fourth period is selected particularly preferably such that the second-order Bragg condition is substantially satisfied in respect of the wavelength of the light emitted in the first resonator segment and partially transmitted by the third resonator segment, and vertical light deflection takes place in the deflection segment. The vertical light deflection is achieved in particular when the second-order Bragg condition is satisfied. This is the case when the fourth period is approximately twice as large as the second period and third period, although the precise value depends on the details of the configuration.

According to a preferred embodiment of the invention, the substrate comprises a support material and comprises a contact layer, on which the photonic crystal is formed. The support material has a bandgap that is larger than the light energy of the emitted light, and a refractive index that is smaller than the refractive index of the first resonator segment. This advantageously prevents light absorption in the substrate and achieves waveguiding parallel to the substrate surface.

According to another particularly preferred embodiment of the invention, the contact layer consists of silicon. The semiconductor elements are arranged in immediate contact with a silicon layer, resulting in a number of advantages. First, this simplifies the integration of the light emitter device according to the invention in an Si-based structure, in particular in an Si-based optoelectronic chip. Second, the silicon is sufficiently electrically conductive to provide an electrical contact to the semiconductor elements at the ends thereof that face the substrate. A contact electrode that facilitates electrical contact between a voltage source and the semiconductor elements and injection of an excitation current can advantageously be arranged on the substrate, in particular on the substrate surface made of silicon, adjacent to the photonic crystal.

The support material for the contact layer particularly preferably consists of silicon dioxide, on which is arranged a silicon layer as the contact layer, which forms the substrate surface and carries the semiconductor elements. The silicon dioxide advantageously has a particularly large bandgap and a low refractive index, with the result that light emitted in the first resonator segment is reflected by the substrate back into the first resonator segment. The thickness of the silicon contact layer is preferably selected such that the resonator quality of the resonator is better than 2500, in particular better than 5000.

According to another preferred embodiment of the invention, the semiconductor elements are arranged in a dielectric embedding layer. The dielectric embedding layer is preferably made from a transparent material, in particular an organic polymer such as benzocyclobutene (BCB) or hydrogen silsesquioxane (HSQ) for example, or an inorganic material. The dielectric embedding layer advantageously provides mechanical stability for the semiconductor elements. In addition, according to a particularly preferred embodiment of the invention, the embedding layer can support an electrical contact layer, which is arranged in contact with the top ends (facing away from the substrate) of the semiconductor elements. The electrical contact layer forms a second contact for connecting the photonic crystal to a voltage source and for injecting an excitation current into the first resonator segment.

Advantages for emitting light into the half-space above the substrate can result if the electrical contact layer is a light-transmissive layer, for instance is made of indium tin oxide (ITO). Alternatively, the electrical contact layer can be a layer that does not transmit light, for instance made of a metal such as gold, in which case the light confinement in the first resonator segment is improved advantageously. The electrical contact layer advantageously further reinforces the light guidance in the light emitter device.

According to a second general aspect of the invention, the aforementioned objective is achieved by a method for operating the claimed light emitter device according to the first general aspect of the invention. During operation of the light emitter device, the light emitter device is coupled to a voltage source device or to a pump device, an excitation current is injected into the first resonator segment, or the first resonator segment is optically excited (optically pumped), and light is emitted through the third resonator segment and optionally the deflection segment.

Different functions of the light emitter device can be realized according to the configuration of the first resonator segment. For example, the first resonator segment can be designed to emit coherent light. According to an alternative, there is the option to configure the first resonator segment as a single-photon emitter.

According to a third general aspect of the invention, the aforementioned objective is achieved by a method for producing a light emitter device according to the first general aspect of the invention. The semiconductor elements of the photonic crystal are grown on the substrate. Preferably, all the semiconductor elements grow simultaneously. Then, for a configuration having electrical excitation, contact is made to the photonic crystal by means of contact electrodes. Growing the semiconductor elements preferably involves direct epitaxial growth or vapor-liquid-solid based growth of the semiconductor elements on the substrate, and/or mask-based deposition of the semiconductor elements on the substrate. Particularly preferably, the semiconductor elements are embedded in a transparent embedding layer.

BRIEF DESCRIPTION OF THE DRAWINGS

Further details and advantages of the invention are described below with reference to the accompanying drawings, in which.

DETAILED DESCRIPTION OF PREFERRED EMBODIMENTS

Features of preferred embodiments of the invention are described below by way of example with reference to a light emitter device which is provided with a deflection segment and is configured as a surface emitter device having directional emission into the half-space above the substrate surface. The surface emitter device has particular advantages when used as a vertical emitter. The practical implementation of the invention is not limited to this embodiment, however. Indeed the light emitter device can be realized without the deflection segment and designed for emission parallel to the substrate surface.

Forms of the semiconductor elements of the light emitter device are, for example, the form of a pillar (or pin, wire or rod) or the form of a wall (or plate). The thickness of the semiconductor elements preferably equals at least 5 nm and/or at most 500 nm, and the height of the semiconductor elements preferably equals at least 300 nm and/or at most 10 µm. The semiconductor elements are preferably produced from a GaN or GaAs compound semiconductor, and are optionally doped, for instance with Si, Ge or Mg (GaN) or with Si, Be, C or Te (GaAs).

Reference is made by way of example to a light emitter device having a photonic crystal that is produced from nanowires. The invention is not limited to the use of nanowires, but can be realized in a corresponding manner by a photonic crystal that is produced from nanowalls or from nanowires and nanowalls. The light emitter device can be designed in particular for electrical excitation or optical excitation of the photonic crystal. In addition, a plurality of photonic crystals can be arranged jointly on one substrate.

Figure 1:
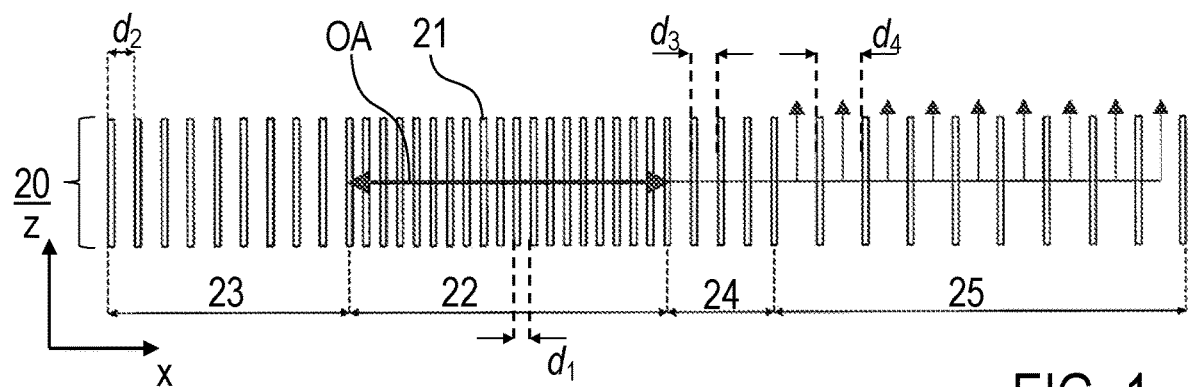
FIG. 1 shows in a schematic side view a photonic crystal of a claimed light emitter device according to the first embodiment of the invention.

FIG. 1 shows a schematic sectional view of a photonic crystal 20 having a plurality of nanowires 21 arranged in a periodic manner on a substrate (not shown in FIG. 1), which form a first resonator segment 22, a second resonator segment 23, a third resonator segment 24 and a deflection segment 25. The sectional view shows the photonic crystal 20 along the plane perpendicular to the substrate surface (x-z plane), wherein the segments 22 to 25 are arranged adjacent to one another in a cavity main direction (light output coupling direction, optical axis OA, x-direction in FIG. 1), and the photonic crystal 20 forms a linear resonator (first embodiment of the invention).

In the plane parallel to the substrate surface (x-y plane, perpendicular to the drawing plane in FIG. 1), all of the segments 22 to 25 have a rectangular basic shape, and therefore the overall photonic crystal 20 has a rectangular basic shape and is not covered in the y-direction (see below).

The nanowires 21 form, for instance, (In,Ga)N-based quantum-well heterostructures, which are produced at a diameter of 50 nm and length of 500 nm. In said segments 22 to 25, the nanowires 21 have different lattice spacings (periods). The first period $d_1$ of the nanowires 21 equals e.g. 110 nm in the first resonator segment 22.

Figure 2:
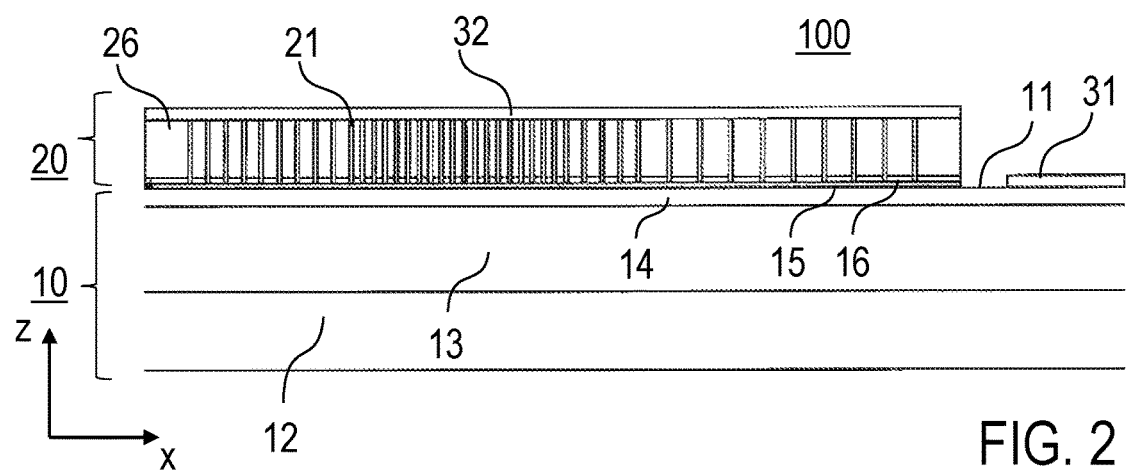
FIG. 2 shows in a sectional view the first embodiment of the light emitter device according to the invention.

In the central first resonator segment 22, light is emitted by the nanowires 21 in response to optical or electrical excitation (see FIG. 2). The dimension of the first resonator segment 22 along the optical axis OA (distance between the second and third resonator segments 23, 24) is selected for resonant superposition of the emitted light according to the wavelength λ of said light (see double-ended arrow), and equals, for example, 2.2 μm.

In the second and third resonator segments 23, 24, the respective second and third periods $d_2 = d_3$ are selected such that the Bragg condition according to equation (1) is satisfied for the resonant wavelength λ of the light emitted in the first resonator segment 22 having an effective refractive index n, and photons emitted in the first resonator segment 22 are confined in this segment:

$$d_B = \lambda/2n \tag{1}$$

In a practical example, the second and third periods $d_2$, $d_3$ are set to 150 nm for an emission wavelength λ of 500 nm in (In,Ga)N-based nanowires 21.

The second and third resonator segments 23, 24 are not identical. Along the optical axis OA, the dimension of the third resonator segment 24 is smaller than the dimension of the second resonator segment 23. In the radiation output coupling direction, the second resonator segment 23, which forms a fully reflecting mirror, comprises 15 nanowires, for instance, whereas the third resonator segment 24, which forms an output coupler, comprises only 5 nanowires, with the result that the dimensions of the second resonator segment 23 and of the third resonator segment 24 equal e.g. 2.1 μm and 0.75 μm along the optical axis OA.

In the deflection segment 25, the nanowires 21 are arranged at a larger spacing. The fourth period (deflection period) $d_4$ is selected, for example, such that in the deflection segment 25 having the effective refractive index n, the second-order Bragg condition according to equation (2)

$$d_O = \lambda/n \tag{2}$$

is satisfied. Vertical extraction in the z-direction of the light coupled out of the first resonator segment 21 is achieved by this fourth period.

The fourth period $d_4$ need not be tuned exactly to the second-order Bragg condition according to equation (2). Instead it is sufficient in the example mentioned for the fourth period $d_4$ to vary about a value of 300 nm. By means of test experiments or numerical simulations, the fourth period $d_4$ can be selected so as to maximize the efficiency of the deflection in the vertical direction. The dimension of the deflection segment 25 equals e.g. 3 μm along the optical axis OA.

FIG. 2 shows a schematic sectional view of a preferred embodiment of the light emitter device 100 according to the invention comprising a substrate 10 and a photonic crystal 20. The substrate 10 has a Si-based layered structure, which provides a substrate surface 11 made of silicon. In detail, the layered structure comprises a support layer 12, which is made of silicon or another semiconductor material or ceramic material, a silicon dioxide layer 13, and a silicon contact layer 14, which forms the substrate surface 11. Depending on the method for producing the nanowires 21 (see below), a buffer layer 15, for instance made of AlN, and a masking layer 16 made of silicon dioxide can be provided on the silicon contact layer 14. The masking layer 16 includes apertures at which the nanowires 21 are grown onto the buffer layer 15, and in which the nanowires 21 are in electrical contact with the silicon contact layer. The substrate 10 has a thickness of 0.5 mm for example.

Adjacent to the photonic crystal 20 is provided a contact electrode 31 on the silicon contact layer 14. The contact electrode 31 preferably comprises a metal layer, for instance made of gold having a thickness of 100 nm.

The nanowires 21 of the photonic crystal 20 are embedded in an embedding layer 26, for instance made of HSQ, which electrically isolates the nanowires 21 from one another and provides mechanical stability to said nanowires. On the top face of the embedding layer 26, the ends of the nanowires 21 are connected to an electrically conductive contact layer 32. The contact layer 32 for instance consists of gold having a thickness of 100 nm.

The contact electrode 31 and the contact layer 32 are provided for connecting to a voltage source and for supplying an electrical excitation current to the semiconductor elements (nanowires 21). Since the electrical excitation of the nanowires 21 is provided solely in the first resonator segment 22, the contact layer 32 can be restricted to the extent of the first resonator segment 22 (see FIG. 3).

Figure 3:
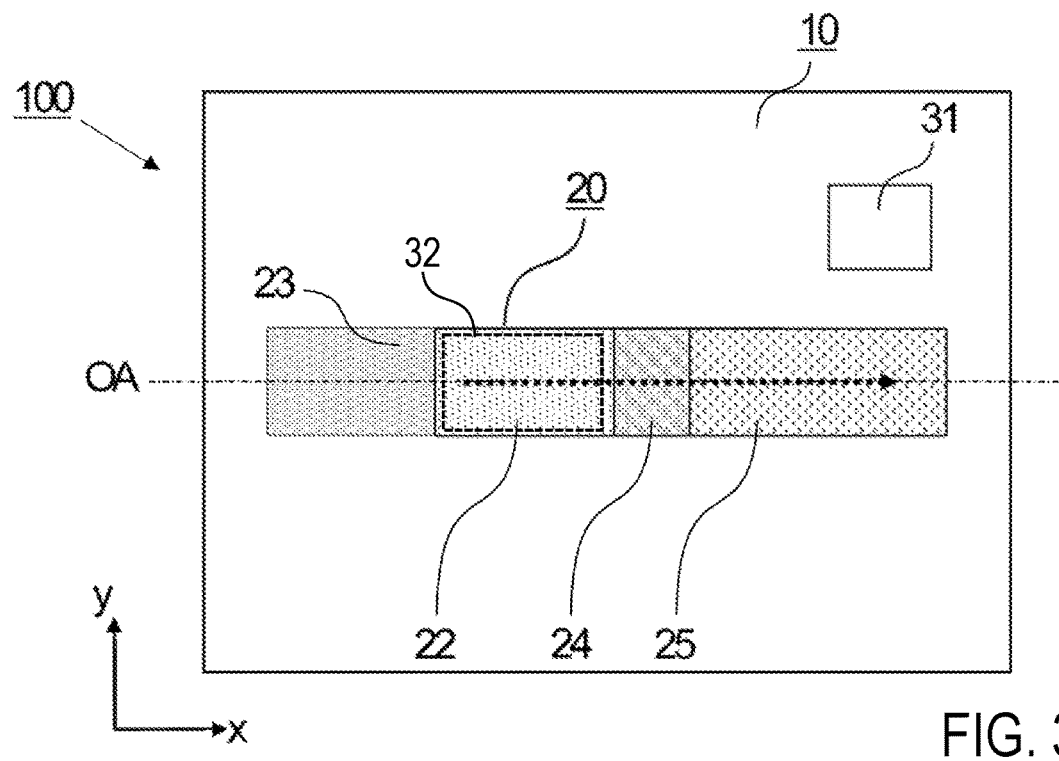
FIG. 3 shows in a schematic plan view the first embodiment of the light emitter device according to the invention.

FIG. 3 shows a schematic plan view of the first embodiment of a light emitter device 100 according to the invention comprising the substrate 10 and the photonic crystal 20. The photonic crystal 20 comprises the central first resonator segment 22, which is enclosed in the x-direction by the second resonator segment 23 and the third resonator segment 24. FIG. 3 also shows the contact electrode 31 on the silicon contact layer 11 on the top face of the substrate 10, and the contact layer 32, which covers (shown dashed) at least the first resonator segment 22 of the photonic crystal 20.

The regions of the second resonator segment 23 and of the third resonator segment 24, which regions are opposite one another, form the end and output coupler mirrors of a linear resonator, the main cavity direction of which (optical axis OA, x-direction) is shown by a dashed line. Linear modes are generated along the optical axis. In accordance with the orientation of the resonator, during operation of the light emitter device 100, light that is excited by optical pumping or electrical excitation and amplified by resonance in the first resonator segment 22, can be coupled out through the third resonator segment 24 (see dotted arrow), and deflected in the deflection segment 25 into the vertical z-direction (perpendicular to the drawing plane).

Figure 4:
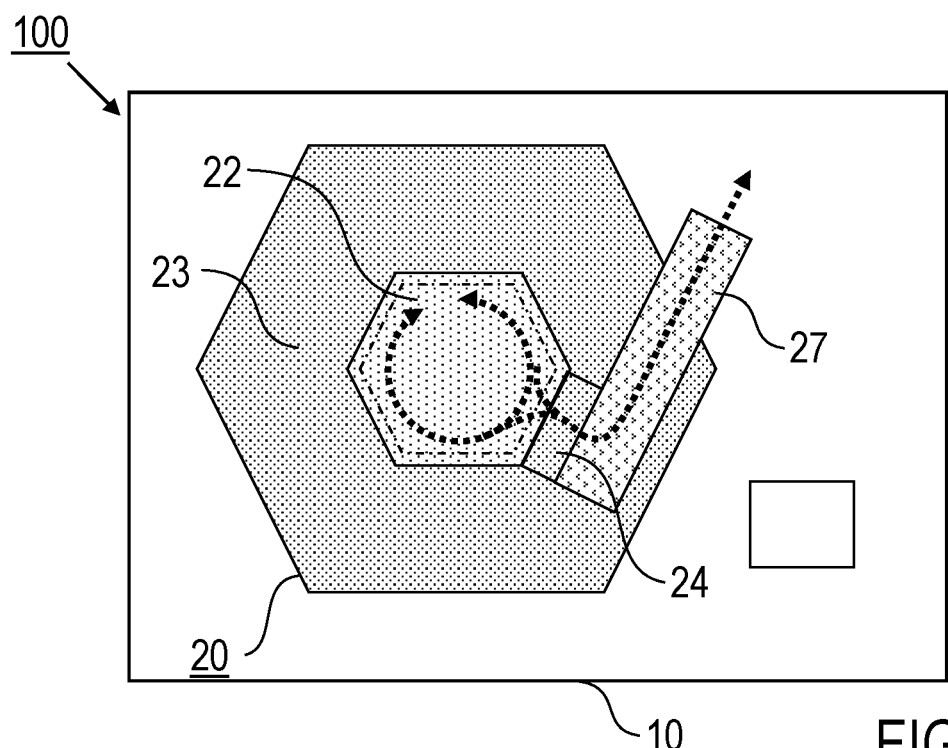
FIG. 4 shows in a schematic plan view the second embodiment of the light emitter device according to the invention.

FIG. 4 shows by way of example a schematic plan view of the second embodiment of the light emitter device 100 comprising the substrate 10 and the photonic crystal 20, wherein in this case the first resonator segment 22 is designed by a hexagonal shape to generate circular modes (see dotted double-ended arrow). The light generated in the first resonator segment 22 is coupled out through the third resonator segment 24 into a waveguide arrangement 27. Onward transmission takes place from the waveguide arrangement 27 into the adjoining space, into an additional waveguide integrated in the substrate, or into a deflection segment (see FIG. 3).

The dimensions of the photonic crystal 20 parallel to the surface of the substrate 10 are selected such that circular modes are generated resonantly at the emission wavelength λ of the nanowires in the first resonator segment 22, and are confined in the radial direction by the second resonator segment 23 except for the region of the third resonator segment 24, and such that output coupling into the waveguide segment 27 takes place at the third resonator segment 24. The dimensions of the second resonator segment 23 and of the third resonator segment 24 in the radial direction can be determined specifically by numerical simulations of the confinement at the second resonator segment 23 and of the output coupling at the third resonator segment 24. In a practical example, the diameter of the first resonator segment 22 equals 350 nm, the width of the second resonator segment 23 in the radial direction equals 2.1 µm, and the width of the third resonator segment 24 in the radial direction equals 100 nm.

A light emitter device 100 according to the invention is preferably produced using a "bottom-up" technique. The nanowires 21 grow selectively in the holes of a mask, which has advantages for precise control of the position of the nanowires 21. For the GaN-based nanowires 21, an AlN buffer layer 15 is applied to the silicon contact layer 14, followed by the deposition of a silicon oxide masking layer 16. The masking layer 16 has openings, which are arranged in accordance with the lattice pattern in which the nanowires 21 are meant to be grown on the substrate 10. The pn heterostructure containing quantum wells for the charge-carrier recombination, which heterostructure is desired for electrical excitation, is achieved with the epitaxial deposition of the semiconductor material in the axial or radial direction along the nanowires 21.

After the growth of the nanowires 21, the embedding layer 26 is formed by applying an HSQ precursor solution to the arrangement of the nanowires 21, for instance by a spin-on process. Once the HSQ has been cured, surface treatment and planarization are carried out until the top ends of the nanowires 21 are exposed.

Then for a light emitter device that is designed for electrical excitation, a gold layer is applied as the electrically conductive contact layer 32 by sputtering, for instance, in order to produce the electrical connections.

Using silicon as the substrate material has a number of advantages in terms of costs and the capability for integration with other optical and electrical components. However, since silicon, as an absorbing material at short wavelengths, can drastically impair the resonator quality (Q factor), the layered structure shown in FIG. 2 having the silicon dioxide support layer 13 is preferably used. The effect of the absorption can be reduced by means of the support layer 13, while the thin silicon contact layer 14 still allows an electrical connection to be made between the nanowires 21 and the contact electrode 31. For long wavelengths, the silicon dioxide support layer 13 allows confinement of the light field from below.

Figure 5:
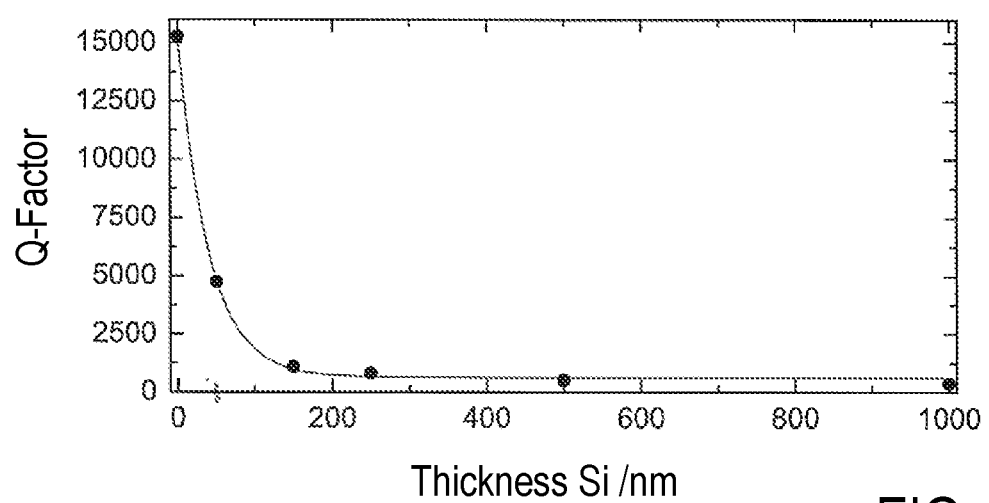
FIG. 5 shows a graph for characterizing the resonator of a light emitter device according to the invention.

FIG. 5 shows the result of a numerical simulation of the resonator quality (Q factor) as a function of the thickness of the silicon contact layer 14 on the silicon dioxide support layer 13. As a result of the light absorption in the silicon, the resonator quality falls exponentially with increasing thickness of the silicon contact layer 14. While the resonator quality without the silicon contact layer 14 would equal over 15,000, the quality drops to 5000 for a thickness of the silicon contact layer of just 50 nm and as far as 1000 for a thickness greater than 150 nm. Advantageously, however, a silicon contact layer 14 having a thickness of less than 40 nm is sufficient to ensure electrical contact is made to the nanowires 21.

The features of the invention disclosed in the above description, in the drawings and in the claims may be relevant, both individually and in combination or in sub-combination, to realizing the invention in its various embodiments.

The invention claimed is:

1. A light emitter device, comprising:
   a substrate, and
   a photonic crystal, which is arranged on the substrate and comprises a plurality of at least one of pillar-shaped and wall-shaped semiconductor elements, which are arranged in a periodic manner protruding from the substrate, wherein
   the photonic crystal forms a resonator, in which the semiconductor elements are arranged in a first resonator segment at a first period ($d_1$), in a second resonator segment at a second period ($d_2$), and in a third resonator segment at a third period ($d_3$), wherein the second period ($d_2$) and the third period ($d_3$) differ from the first period ($d_1$), wherein the second resonator segment surrounds the first resonator segment on multiple sides, the third resonator segment is arranged on a single side of the first resonator segment, and the photonic crystal forms a circular resonator,
   the first resonator segment forms a light emitting medium,
   the third resonator segment forms an output coupling region, through which some of a light field in the first resonator segment can be coupled out of the resonator in a light output coupling direction parallel to a substrate surface of the substrate, and
   at least one waveguide segment is provided, which adjoins the third resonator segment.

2. The light emitter device according to claim 1, wherein the second resonator segment surrounds the first resonator segment on the substrate over an angular range of at least 300°.

3. The light emitter device according to claim 1, wherein the third resonator segment has a smaller dimension in the light output coupling direction than the second resonator segment.

4. The light emitter device according to claim 1, wherein the second period ($d_2$) and the third period ($d_3$) are equal.

5. The light emitter device according to claim 1, wherein the at least one waveguide segment is formed by additional semiconductor elements or integrally with the substrate.

6. The light emitter device according to claim 1, wherein the semiconductor elements are arranged adjoining the second resonator segment or the waveguide segment in a deflection segment at a fourth period ($d_4$), which differs from the first period, second period and third period ($d_1$, $d_2$, $d_3$), and form a vertical coupler.

7. The light emitter device according to claim 6, wherein the fourth period ($d_4$) is selected to satisfy a second-order Bragg condition.

8. The light emitter device according to claim 1, wherein the substrate comprises a contact layer, on which the photonic crystal is formed and which is arranged on a support material having a bandgap that is larger than ae light energy of emitted light, and having a refractive index that is smaller than the refractive index of the first resonator segment.

9. The light emitter device according to claim 1, wherein the substrate comprises silicon.

10. The light emitter device according to claim 9, wherein the substrate comprises a silicon dioxide layer having a silicon contact layer.

11. The light emitter device according to claim 1, wherein the semiconductor elements are arranged in a dielectric embedding layer.

12. The light emitter device according to claim 11, wherein
the embedding layer carries an electrically conductive contact layer.

13. A method for operating a light emitter device according to claim 1, comprising the steps:
coupling the light emitter device to a voltage source device or a pump device;
electrically or optically exciting the first resonator segment; and
emitting light through the third resonator segment.

14. The method for producing a light emitter device according to claim 1, comprising the steps:
providing the substrate; and
growing the semiconductor elements of the photonic crystal on the substrate.

15. The method according to claim 14, comprising the step:
contacting the photonic crystal with contact electrodes.

16. The method according to claim 14, wherein
growing the semiconductor elements comprises at least one member selected from the group consisting of direct epitaxial growth of the semiconductor elements on the substrate, vapor-liquid-solid based growth of the semiconductor elements on the substrate, and mask-based deposition of the semiconductor elements on the substrate.

17. The method according to claim 14, wherein
the semiconductor elements are embedded in a transparent embedding layer.

18. The light emitter device according to claim 9, wherein
a substrate surface of the substrate comprises silicon.

19. The light emitter device according to claim 12, wherein
the electrically conductive contact layer is a reflective contact layer.

* * * * *